United States Patent
Sparrow (12)

(10) Patent No.: US 6,669,920 B2
(45) Date of Patent: *Dec. 30, 2003

(54) BELOW 160NM OPTICAL LITHOGRAPHY CRYSTAL MATERIALS AND METHODS OF MAKING

(75) Inventor: Robert W. Sparrow, Sturbridge, MA (US)

(73) Assignee: Corning Incorporated, Corning, NY (US)

(*) Notice: Subject to any disclaimer, the term of this patent is extended or adjusted under 35 U.S.C. 154(b) by 98 days.

This patent is subject to a terminal disclaimer.

(21) Appl. No.: 09/991,315

(22) Filed: Nov. 20, 2001

(65) Prior Publication Data

US 2003/0094129 A1 May 22, 2003

(51) Int. Cl.$^7$ .............................. G02B 1/02; C30B 11/00
(52) U.S. Cl. ........................... 423/490; 117/81; 117/82; 117/83; 117/940; 430/321; 355/53; 355/77
(58) Field of Search ............................... 117/81, 82, 83, 117/940; 423/490; 430/321; 355/53, 77

(56) References Cited

U.S. PATENT DOCUMENTS

| | | | |
|---|---|---|---|
| 2,498,186 A | | 2/1950 | Stockbarger et al. |
| 2,550,173 A | | 4/1951 | Swinehart et al. |
| 3,766,080 A | | 10/1973 | Swinehart et al. |
| 3,769,230 A | | 10/1973 | Robinson et al. |
| 3,959,442 A | | 5/1976 | Pastor et al. |
| 4,038,201 A | | 7/1977 | Hargreaves |
| 4,048,514 A | | 9/1977 | Haussuehl et al. |
| 4,053,572 A | * | 10/1977 | Moss et al. .................. 423/490 |
| 4,101,331 A | | 7/1978 | Anderson |
| 4,128,589 A | | 12/1978 | Pastor et al. |
| 5,000,548 A | | 3/1991 | Mercado |
| 5,039,858 A | | 8/1991 | Anderson et al. |
| 5,471,493 A | | 11/1995 | Mirov et al. .................... 372/42 |
| 5,517,516 A | | 5/1996 | Marshall et al. ............... 372/41 |
| 5,809,048 A | | 9/1998 | Shichijyo et al. ............. 372/32 |
| 5,852,623 A | | 12/1998 | Castillo et al. ............... 372/41 |
| 5,852,627 A | | 12/1998 | Ershov |
| 5,856,991 A | | 1/1999 | Ershov |
| 5,901,163 A | | 5/1999 | Ershov |
| 5,970,082 A | | 10/1999 | Ershov |
| 5,978,409 A | | 11/1999 | Das et al. |
| 5,982,800 A | | 11/1999 | Ishihara et al. |
| 6,009,114 A | | 12/1999 | Otake .......................... 372/75 |
| 6,069,749 A | | 5/2000 | Omura |
| 6,181,480 B1 | | 1/2001 | Ito |
| 6,201,634 B1 | | 3/2001 | Sakuma et al. |
| 6,298,080 B1 | | 10/2001 | Heist et al. |
| 6,309,461 B1 | | 10/2001 | Gianoulakis et al. |
| 6,332,922 B1 | * | 12/2001 | Sakuma et al. .................. 117/3 |
| 6,342,312 B2 | | 1/2002 | Oba et al. |
| 6,377,338 B1 | | 4/2002 | Suenaga |
| 6,395,657 B2 | * | 5/2002 | Mayolet et al. ................. 501/3 |
| 6,451,106 B1 | * | 9/2002 | Mayolet et al. ............... 117/11 |
| 6,451,111 B1 | | 9/2002 | Beall et al. |
| 6,488,769 B1 | * | 12/2002 | Oba ............................ 117/68 |
| 2002/0011202 A1 | | 1/2002 | Gianoulakis et al. |
| 2002/1012497 | | 8/2002 | Sparrow |

FOREIGN PATENT DOCUMENTS

| | | |
|---|---|---|
| DE | 1 291 321 | 3/1969 |
| DE | 222 426 A1 | 5/1998 |
| EP | 0 875 778 A1 | 11/1998 |
| EP | 0 942 297 | 9/1999 |
| EP | 1 006 373 A2 | 6/2000 |
| EP | 0 869 203 B1 | 8/2001 |
| EP | 1 130 419 A2 | 9/2001 |
| EP | 1 139 138 B1 | 10/2001 |
| JP | 09-315894 | 12/1997 |
| JP | 10 1998-1310 | 1/1998 |
| JP | 10 1998-59799 | 3/1998 |
| WO | 91/11734 | 8/1991 |
| WO | 0 942 297 A2 | 9/1999 |
| WO | 99/46836 | 9/1999 |
| WO | 00/75697 A1 | 12/2000 |
| WO | 01/01182 | 1/2001 |
| WO | 01/37052 A1 | 5/2001 |
| WO | 02/31232 | 4/2002 |

OTHER PUBLICATIONS

"Growth and Properties of Scintillating Crystals BaF2," Jiang et al., *Journal of Crystal Growth*, vol. 79, No. 1–3, Dec. 1986, pp. 720–722.

"Modern Optical Engineering–The Design of Optical Systems," Warren J. Smith, *Modern Opt Eng*, McGraw–Hill Book Company, 1966, Article: "Optical Materials and Coatings," pp 145–161; Article: "The Design of Optical Systems: General," pp 326–355.

U.S. Ser. No. 09/327,043, filed Jun. 7, 1999, Gianoulakis et al., Crystal Growth and Annealing Method and Apparatus, pp. 1–21.

OPTOVAC, Optical Crystal Handbook, Jan. 1993, pp. 1–41.

"Optical Characteristics of Large Singel Crystals of Fluorides", Chernevskaya, E.G., et al., Opt. Technol. (USSR), Jun. 1973, vol. 40, No. 6 pp. 379–380.

Svetlto, O, Principles of Lasers:, 3$^{rd}$ Ed., 1989, pp. 330–331.

Lambda Physik webpage: www.lambdaphysik.com/Microlithography/fullstory.asp?news_id=22, Lithography News, Lambda Physik Ships Fifth 157nm Lithography Laser, p. 1.

(List continued on next page.)

Primary Examiner—Robert Kunemund
(74) Attorney, Agent, or Firm—Walter M. Douglas; Edward F. Murphy

(57) ABSTRACT

The present invention provides below 160 nm optical lithography crystal materials for VUV optical lithography systems and processes. The invention provides fluoride optical lithography crystals for utilization in 157 nm optical microlithography elements which manipulate below 193 nm optical lithography photons. The present invention provides methods of making below 160 nm optical lithography crystal materials for below 160 nm VUV optical lithography systems and processes.

31 Claims, No Drawings

OTHER PUBLICATIONS

Lambda Physik webpage: www.lambdaphysik.com/Microlithography/novaline.asp, Novaline® Lithography Series, pp. 1–2.

Lambda Physik webpabe: www.lambdaphysik.com/Microlithography/mooreslaw.asp, Lithography—History, Moore's Law, pp. 1–3.

"Lambda Physik Fourth Annual 157nm/EUV Symposium" website: http://www.lambdaphysik.com/microlithography/157. (printed out 11/01).

Lambda Physik webpage: www.lambdaphysik.com/Microlithography/fullstory.asp, Lithography News, Lambda Physik Announces Breakthrough in 157 nm F2 Lithography, pp. 1–2.

"Spatial Dispersion in the Dielectric Constant of GaAs," Yu et al., *Solid State Comm*, vol. 9, pp. 1421–1424, 1971.

"Technology at a Glance–Fall 2001," Website: http://www.nist.gov/public_affairs/taglance/tag01fall/fall2001.htm, pp 1–11.

"Semicon West 2001," Website: http://www.nist.gov/public_affairs/factsheet/semiconwest01.htm.

"Metrology Supporting Deep Ultraviolet Lithography." Website:http://www.eeel.nist.gov/810.0/lithography_deep-.html, published Jun. 2001, Ofc of Microelectronic Programs.

"Minimizing Spatial–dispersion–induced birefringence in crystals used for precision optics by using mixed crystals of materials with the opposite sign of the birefringence." Website: http://physics.nist.gov/Divisions/Div842/Gp3/DUV-MatChar/birefring.html. updated Aug. 1, 2001.

"The Trouble with Calcium Fluoride." *SPIEs oeMagazine*, pp 23–25, Mar. 2002.

"$Ca_{1-x}Ba_xF_2$ and $Ca_{1-x}Sr_xF_2$ Mixed Crystals as potential solution to intrinsic birefringence problem for 157nm lithography," Burnett et al., *SEMATECH 157nm Tech Data Rev*, Dec. 11, 2001, NIST.

"Stress–Optical coefficients of 157nm Materials," Burnett et al., *SEMATECH 157nm Tech Data Rev*, Dec. 11, 2001, NIST.

"Intrinsic Birefringence in 157nm Materials," Burnett et al., $2^{nd}$ *Int'l Symposium on 157nm Lithography*, May 15, 2001, NIST.

NIST updates for Jul. 9, 2001, website: http://www.nist.gov/public_affairs/update/upd010709.htm, pp 1–8.

"Electron and Optical Physics Division" website: http://physics.nist.gov/TechAct/Div841/div 841h.html, *Tech Activities 2001*, pp 1–9.

"Atomic Physics Division" website: http://physics.nist.gov/TechAct/Div842/div842h.html, *Tech Activities 2001*, pp 1–17.

"Plasma Radiation Group; DUV Sources and Materials Characterization" website: http://physics.nist.gov/Divisions/Div 842/Gp3/DIVMatChar/index.html., pp 1–2.

"Absolute refractive indices and thermal coefficients of fused silica and calcium fluoride near 193 nm," *Appl Optics*, vol. 37, No. 25, Sep. 1, 1998, pp 5964–5968.

"Intrinsic Birefringence in calcium fluoride and barium fluoride," *Phys Review B*, vol. 64, 241102(r), pp 1–4.

"Polarizability of Fluoride Ions in Fluorides with Fluorite–type structure" Sorokin, N.I., *Crystallography Reports*, vol. 45, No. 6, 2000, pp 976–978.

"Optical Anisotrphy of Silicon Single Crystals" Pastrnak et al., *Phys Review B*, vol. 3, No. 8, Apr. 15, 1971, pp 2567–2571.

Barium Fluoride and Magnesium Fluoride Product Information, ISP Corp, www.ispoptics.com.

Barium Fluoride Patinal product info, EM Industries, website: www.emicoe.com/barfluor.cfm.

"Materials Problem snags 157nm lithography" *EETimes* website: www.eetimes.com/story/OEG20010720SO106, Jul. 20, 2001, 4 pages.

"Industry Weights shfit to 157nm lithography" *EETimes* website: ww.eetimes.com/story/OEG20000518S0010, May 18, 2000, 4 pages.

"Growth of Pure and Doped KMgF3 Single Crystals," Darabont, Journal of Crystal Growth 1996 vol. 169(1) abstract.

* cited by examiner

BELOW 160NM OPTICAL LITHOGRAPHY CRYSTAL MATERIALS AND METHODS OF MAKING

BACKGROUND OF THE INVENTION

Field of the Invention

The present invention relates generally to optical lithography, and particularly to optical microlithography crystals for use in optical photolithography systems utilizing vacuum ultraviolet light (VUV) wavelengths below 193 nm, preferably below 175 nm, more preferably below 164 μm, such as below 160 nm VUV projection lithography refractive systems utilizing wavelengths in the 157 nm region.

Semiconductor chips such as microprocessors and DRAM's are manufactured using a technology called "Optical Lithography". An optical lithographic tool incorporates an illuminating lens system for illuminating a patterned mask, a light source and a projection lens system for creating an image of the mask pattern onto the silicon substrate.

The performance of semiconductors have been improved by reducing the feature sizes. This in turn has required improvement in the resolution of the optical lithographic tools. In general, the resolution of the transferred pattern is directly proportional to the numerical aperture of the lens system and inversely proportional to the wavelength of the illuminating light. In the early 1980's the wavelength of light used was 436 nm from the g-line of a mercury lamp. Subsequently the wavelength was reduced to 365 nm (I-line of mercury lamp) and currently the wavelength used in production is 248 nm obtained from the emission of a KrF laser. The next generation of lithography tools will change the light source to that of an ArF laser emitting at 193 nm. The natural progression for optical lithography would be to change the light source to that of a fluoride laser emitting at 157 nm. For each wavelength different materials are required to fabricate lenses. At 248 nm the optical material is fused silica. For 193 nm systems there will be a combination of fused silica and calcium fluoride lenses. At 157 nm fused silica does not transmit the laser radiation. At present the preferred material for use at 157 nm is pure calcium fluoride crystal.

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of vacuum ultraviolet wavelengths below 193 nm, such as 157 nm has been hindered by the transmission nature of such vacuum ultraviolet wavelengths in the 157 nm region through optical materials. For the benefit of vacuum ultraviolet photolithography in the 157 nm region such as the emission spectrum VUV window of a $F_2$ excimer laser to be utilized in the manufacturing of integrated circuits there is a need for optical lithography crystals that have beneficial optical properties below 164 nm and at 157 nm.

The present invention overcomes problems in the prior art and provides a fluoride optical lithography crystal that can be used to improve the manufacturing of integrated circuits with vacuum ultraviolet wavelengths.

SUMMARY OF THE INVENTION

One aspect of the present invention is a below 160 nm optical lithography barium fluoride crystal. The barium fluoride crystal has a refractive index wavelength dispersion $dn/d\lambda < -0.003$ at 157 nm.

In another aspect, the present invention includes a dispersion management optical lithography crystal. The dispersion management crystal is an isotropic barium fluoride crystal. Preferably the barium fluoride crystal has a 157.6299 nm refractive index wavelength dispersion $dn/d\lambda$ less than −0.003 and a 157.6299 nm refractive index $n>1.56$.

In a further aspect, the present invention includes a below 160 nm optical lithography method which comprises providing a below 160 nm optical lithography illumination laser, providing a calcium fluoride crystal optical element, providing a barium fluoride crystal optical element having a below 160 nm refractive index wavelength dispersion $dn/d\lambda < -0.003$, and transmitting the below 160 nm optical lithography light through the calcium fluoride optical element and the barium fluoride optical element to form an optical lithography pattern.

In another aspect, the present invention includes a method of making a dispersion managing optical lithography element. The method includes providing a barium fluoride source material, melting the barium fluoride source material to form a precrystalline barium fluoride melt, solidifying the barium fluoride melt into a barium fluoride crystal and annealing the barium fluoride crystal to provide an isotropic barium fluoride crystal with a 157 nm refractive index wavelength dispersion $dn/d\lambda < -0.003$.

Additional features and advantages of the invention will be set forth in the detailed description which follows, and in part will be readily apparent to those skilled in the art from the description or recognized by practicing the invention as described herein, including the detailed description which follows and the claims.

It is to be understood that both the foregoing general description and the following detailed description are merely exemplary of the invention, and are intended to provide an overview of framework for understanding the nature and character of the invention as it is claimed.

Wherein reducing the wavelength of the illuminating light for lithography processes is necessary to achieve higher resolution, the illuminating light laser emission has a finite bandwidth. To achieve the resolution required at the 100 nm node, the optical lithography tool manufacturer using an all refractive optical design can either use a very highly line narrowed laser (to less than 2 pm) or can use two optical materials which have dispersion properties that compensate for the bandwidth of the laser.

In a preferred embodiment the invention includes providing isotropic optical lithography crystalline materials for color correction for VUV lithography in general but especially in the region of 157 nm to enable refractive lenses to be constructed to make use of the light from a fluoride excimer laser that has not been line narrowed to below 2 pm. The invention includes a range of fluoride crystalline materials that provide benefits to 157 nm optical lithography. In the preferred embodiment the dispersion managing optical lithography crystal is utilized in conjunction with a 157 nm optical lithography illumination laser with a bandwidth not less than 0.2 picometers.

DETAILED DESCRIPTION OF THE PREFERRED EMBODIMENTS

The refractive index of a material varies with the wavelength of energy passing through it and this is called the dispersion of the material. Hence if light passing through a lens system, constructed of one optical material, has a range of wavelengths then each wavelength would be brought to a different focus so reducing resolution. This effect can be overcome by using a second optical material with different dispersion characteristics. This technique is known as color correction. To be of use as a color correction material, there are specific criteria that have to be met, namely the material must transmit at the wavelength of operation, it must be isotropic and must have optimum dispersion characteristics. At 157 nm, the only material that has had its dispersion characteristics measured to the necessary degree of accuracy is calcium fluoride. Applying the criteria of 157 nm transmission and of being isotropic, the following materials can be used as color correction materials.

I. Materials Based on Alkali Metal Fluorides:

Lithium fluoride, sodium fluoride, potassium fluoride, and materials of the formula: $MRF_3$ in which M is either Li, Na or K and R is either Ca, Sr, Ba or Mg. Examples of such materials include but are not limited to: $KMgF_3$, $KSrF_3$, $KBaF_3$, $KCaF_3$, $LiMgF_3$, $LiSrF_3$, $LiBaF_3$, $LiCaF_3$, $NaMgF_3$, $NaSrF_3$, $NaBaF_3$, and $NaCaF_3$.

II. Materials Based on Alkaline Earth Metal Fluorides:

Calcium fluoride, barium fluoride and strontium fluoride. Each of these materials can be combined with the other to form a mixed crystal of the formula $(M1)_x(M2)_{1-x}F_2$ in which M1 is either Ba, Ca or Sr and M2 is either Ba, Ca or Sr and x is an quantity between 0 and 1. Non-limiting examples are $Ba_{0.5}Sr_{0.5}F_2$ in which x=0.5 and $Ba_{0.25}Sr_{0.75}F_2$, in which x=0.75. When x=0, the materials are $CaF_2$, $BaF_2$, $SrF_2$ III. Materials Based on Mixed Crystals of the Formula $M_{1-x}R_xF_{2+x}$, in Which M is Either Ca, Ba or Sr and R is Lanthanum.

In such materials the structure of the crystal is isotropic up to x values of 0.3. Examples of this formula include but are not limited to $Ca_{0.72}La_{0.28}F_{2.28}$ in which x=0.28 or $Ba_{0.74}La_{0.26}F_{2.26}$ in which x=0.26 or of the type $Sr_{0.79}La_{0.21}F_{2.21}$ in which x=0.21.

Each of the above materials I, II and III can be manufactured using a technique known as the "Stockbarger" or "Bridgman" technique of crystal growth. This process comprises loading the powder of the material to be grown into a container known as a crucible. The crucible which usually is made of high purity graphite is positioned on a moveable support structure within a heater with sufficient power to raise the temperature to a level above the melting point of the material to be grown. After assembling the heater system around the crucible, the system is closed with a bell jar and evacuated using a combination of vacuum pumps. After a vacuum exceeding $10^{-5}$ Torr has been achieved, power is applied to the heater and is continually raised until a preset level has been achieved. This preset level of power is defined by melt trial runs. After a period of several hours at the melt power, the moveable support structure is activated and the crucible is made to slowly descend in the furnace. As the tip of the crucible descends, it cools and the molten material begins to freeze. By continuing the descent there is progressive solidification until all the melt is frozen. At this point, the power to the furnace is reduced to below the melt power, the crucible is raised back into the heater, allowed to reach thermal equilibrium over a period of several hours and then allowed to cool to room temperature by slowly reducing the power to the heaters. Once at room temperature, the vacuum is released, the bell jar removed followed by the heaters and the crystal can be removed from the crucible.

Although the Bridgman or Stockbarger method of crystal growth is the usual method of growing crystals of fluoride based materials, it is not the only method available. Techniques such as the Czochralski, Kyropoulos or Stober methods can also be utilized.

The size and shape of the disks resulting from these materials are variable e.g. for lenses: 118–250 mm in diameter by 30–50 mm in thickness. The disks are ground in a conventional manner to lenses of about the same dimensions and having the desired curvature. The lenses have a general application, for example, whenever color correction is required. The lenses can then be incorporated in a wide variety of optical systems, e.g. lasers including but limited to the 157 nm systems, spectrography systems, microscopes and telescopes.

The preceding specific embodiments are to be construed as merely illustrative, and not limitative of the remainder of the disclosure in any way whatsoever.

The entire disclosure of all applications, patents and publications, cited above and below, are hereby incorporated by reference.

From the foregoing description one skilled in the art can easily ascertain the essential characteristics of this invention, and without departing from the spirit and scope thereof, can make various changes and modifications of the invention to adapt it to various usages and conditions.

The invention includes a below 160 nm optical crystal transmitting for use with a below 160 nm lithography laser having a bandwidth of at least 0.2 pm. The optical lithography crystal is comprised of an isotropic barium fluoride crystal which has a 157 nm transmission greater than 85% and a refractive index wavelength dispersion $dn/d\lambda < -0.003$ at 157 nm. Preferably the barium fluoride crystal has a 157 nm, refractive index wavelength dispersion $dn/d\lambda < -0.004$, and more preferably $< -0.0043$. Preferably the barium fluoride crystal has a 157 nm refractive index index $n > 1.56$. More preferably $n \geq 1.6$, and most preferably $n \geq 1.64$. Preferably the barium fluoride crystal has a 157 nm refractive index temperature coefficient $dn/dt > 8 \times 10^{-6}/°$ C., and more preferably $dn/dt \geq 8.5 \times 10^{-6}/°$ C. In a preferred embodiment the optical lithography barium fluoride crystal has a large dimension diameter >100 mm and a thickness >30 mm, and more preferably a diameter in the range of about 118 to 250 nm and a thickness in the range of about 30 to 50 mm. When utilized with a broadband width illumination source such as an $F_2$ excimer laser with a bandwidth of at least 0.5 pm, said barium fluoride crystal comprises a bandwidth dispersion managing optical element. Preferably the barium fluoride optical lithography crystal has a sodium contamination content <10 ppm by weight, more preferably <5 ppm by weight, and most preferably <1 ppm. Preferably the barium fluoride optical lithography crystal has a total rare earth contaminant content of less than 1 ppm by weight. Preferably the barium fluoride optical lithography crystal has a total oxygen contaminant content of less than 50 ppm by weight, and more preferably <20 ppm. Such low contaminant levels provide beneficial optical characteristics, and preferably the crystal has a 157 nm transmission $\geq 86\%$, and more preferably $\geq 88\%$.

In a further aspect the invention includes a below 160 nm dispersion management optical lithography crystal. The dispersion management optical lithography crystal comprises an isotropic barium fluoride crystal having a 157.6299 nm refractive index wavelength dispersion $dn/d\lambda < -0.003$ and a 157.6299 nm refractive index $n > 1.56$. Preferably the dispersion management crystal's $dn/d\lambda < -0.004$, and more preferably $dn/d\lambda < -0.0043$. Preferably the crystal's refractive index $n > 1.6$.

In a further aspect the invention includes a below 160 nm optical lithography method which includes providing a below 160 nm optical lithography illumination laser, providing a calcium fluoride crystal optical element, and providing a barium fluoride crystal optical element having a below 160 nm refractive index wavelength dispersion dn/dλ which is <−0.003. The method includes transmitting below 160 nm optical lithography light through the calcium fluoride optical element and the barium fluoride optical element to form an optical lithography pattern, preferably with feature dimensions ≦100 nm. Providing the barium fluoride crystal optical element preferably includes loading a barium fluoride crystal feedstock into a container, melting the feedstock to form a precrystallline barium fluoride melt, and progressively freezing the barium fluoride melt into a barium fluoride crystal. The method preferably further includes heating the barium fluoride crystal and slowly thermal equilibrium cooling the crystal and forming the barium fluoride crystal into an optical element. Preferably the illumination laser has a bandwidth ≧0.5 pm, and preferably ≧1 pm. In another aspect the invention includes the method of making a dispersion managing optical lithography element. The method includes providing a barium fluoride source material, melting the barium fluoride source material to form a precrystalline barium fluoride melt, solidfying the barium fluoride melt into a barium fluoride crystal, and annealing the barium fluoride crystal to provide an isotropic barium fluoride crystal with a 157 nm refractive index wavelength dispersion dn/dλ<−0.003. The method preferably includes providing a contaminant removing fluoride scavenger and melting the scavenger with the barium fluoride source material to remove contaminants. Preferably the scavenger is lead fluoride.

EXAMPLE

Barium fluoride optical lithography crystal samples were produced. 157 nm range refractive index measurements were made on a produced crystal. 157 nm range transmission exposures were made on a produced crystal.

Crystals were grown in high purity graphite crucible containers. High purity barium fluoride powder was loaded into the crucible. The loaded crucible was positioned on a movable support structure within a crystal growing heater device with sufficient power to raise the temperature to a temperature above 1280° C. The barium fluoride powder was melted above 1280° C. into a precrystalline barium fluoride melt, then the crucible was lowered through a 1280° C. containing thermal gradient to progressively freeze solidify the melt into a crystalline form. The formed crystal was then annealled by heating to a temperature below 1280° C. and then slowly cooling to allow the barium fluoride crystal to reach thermal equilibrium and reduce stress and birefringence of the crystal. Such formed barium fluoride crystal samples were then analyzed. A 157 nm transmission laser durability sample showed an external transmission of 86%. A 157 nm absolute refractive index sample showed a 157 nm dispersion at 20° C. of dn/dλ (157.6299)=−0.004376±0.000004 nm$^{-1}$ with the absolute refractive index at the 157 nm wavelength of 157.6299, n(λ=157.6299)= 1.656690±0.000006, and also the refractive index temperature coefficient about 20° C. was found to be dn/dT (approx. 20° C., 1 atmosphere N$_2$)=10.6 (±0.5)×10$^{-6}$/° C. and dn/dT (approx. 20° C., vacuum)=8.6 (±0.5)×10$^{-6}$/° C.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A below 160 nm optical lithography crystal material for use in a 157 nm wavelength lithography refractive system, said below 160 nm optical lithography crystal material transmitting 157 nm wavelengths and comprised of an isotropic alkaline earth metal mixed crystal, said alkaline earth metal mixed crystal material having a formula of $(M1)_x(M2)_{1-x}F_2$ where M1 is a first alkaline earth metal chosen from the alkaline earth metal group consisting of Ca, Sr, and Ba, and M2 is a second alkaline earth metal chosen from the alkaline earth metal group consisting of Ca, Sr, and Ba, and x is between 0 and 1; and M2 is an alkaline earth metal different from M1.

2. An optical lithography crystal material as claimed in claim 1, wherein M1 is Sr and M2 is Ba.

3. An optical lithography crystal material as claimed in claim 1, wherein M1 is Sr and M2 is Ba and x is 0.5.

4. An optical lithography crystal material as claimed in claim 1, wherein M1 is Sr and M2 is Ba and x is 0.75.

5. An optical lithography crystal material as claimed in claim 1, wherein M1 is Sr and M2 is Ba and x is in the range from 0.5 and 0.75.

6. An optical lithography crystal material as claimed in claim 1, wherein M1 is Sr and x is in the range from 0.5 and 0.75.

7. An optical lithography crystal material as claimed in claim 1, wherein M2 is Ba and x is in the range from 0.5 and 0.75.

8. An optical lithography crystal material as claimed in claim 1, wherein M1 is Sr.

9. An optical lithography crystal material as claimed in claim 1, wherein M2 is Ba.

10. An optical lithography crystal material as claimed in claim 1, wherein M1 is Sr and M2 is Ca.

11. An optical lithography crystal material as claimed in claim 1, wherein M1 is Ca and M2 is Ba.

12. An optical lithography crystal as claimed in claim 1, wherein said alkali metal alkaline earth metal mixed crystal has a 157 nm transmission ≧86%.

13. An optical lithography crystal as claimed in claim 1, wherein said alkali metal alkaline earth metal mixed crystal has a 157 nm refractive index n>1.56.

14. An optical lithography crystal as claimed in claim 1, wherein said alkali metal alkaline earth metal mixed crystal has a 157 nm refractive index wavelength dispersion dn/dλ<−0.003.

15. An optical lithography crystal as claimed in claim 1 having a large dimension diameter >100 mm and a thickness >30 mm.

16. An optical lithography crystal as claimed in claim 1 having a diameter in the range of about 118 to 250 mm and a thickness in the range of about 30 to 50 mm.

17. An optical lithography crystal as claimed in claim 1 wherein said crystal is a color correction lens.

18. A below 160 nm optical lithography crystal material for use in a 157 nm wavelength lithography refractive system, said below 160 nm optical lithography crystal material transmitting 157 nm wavelengths and comprised of an isotropic alkaline earth metal lanthanum mixed crystal, said alkaline earth metal lanthanum mixed crystal material having a formula of $M_{1-x}R_xF_{2+x}$ where M is a alkaline earth metal chosen from the alkaline earth metal group consisting of Ca, Sr, and Ba, and R is lanthanum, and x is no greater than 0.3.

19. An optical lithography crystal material as claimed in claim 18, wherein M is Ca.

20. An optical lithography crystal material as claimed in claim 18, wherein M is Ba.

21. An optical lithography crystal material as claimed in claim 18, wherein M is Sr.

22. An optical lithography crystal material as claimed in claim 18, wherein M is Ca and x=0.28.

23. An optical lithography crystal material as claimed in claim 18, wherein M is Ba and x=026.

24. An optical lithography crystal material as claimed in claim 18, wherein M is Sr and x=0.21.

25. An optical lithography crystal material as claimed in claim 18, wherein x is in the range from 0.21 and 0.28.

26. An optical lithography crystal as claimed in claim 18, wherein said alkali metal alkaline earth metal mixed crystal has a 157 nm transmission $\geq 86\%$.

27. An optical lithography crystal as claimed in claim 18, wherein said alkali metal alkaline earth metal mixed crystal has a 157 nm refractive index n>1.56.

28. An optical lithography crystal as claimed in claim 18, wherein said alkali metal alkaline earth metal mixed crystal has a 157 nm refractive index wavelength dispersion $dn/d\lambda < -0.003$.

29. An optical lithography crystal as claimed in claim 18 having a large dimension diameter >100 mm and a thickness >30 mm.

30. An optical lithography crystal as claimed in claim 18 having a diameter in the range of about 118 to 250 mm and a thickness in the range of about 30 to 50 mm.

31. An optical lithography crystal as claimed in claim 18 wherein said crystal is a color correction lens.

\* \* \* \* \*